(12) United States Patent
Willer et al.

(10) Patent No.: US 7,365,382 B2
(45) Date of Patent: Apr. 29, 2008

(54) SEMICONDUCTOR MEMORY HAVING CHARGE TRAPPING MEMORY CELLS AND FABRICATION METHOD THEREOF

(75) Inventors: Josef Willer, Riemerling (DE); Thomas Mikolajick, Dresden (DE); Christoph Ludwig, Langebruck (DE); Norbert Schulze, Radebeul (DE); Karl-Heinz Kuesters, Boxdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/067,983

(22) Filed: Feb. 28, 2005

(65) Prior Publication Data

US 2006/0192266 A1 Aug. 31, 2006

(51) Int. Cl.
*H01L 29/76* (2006.01)
(52) U.S. Cl. .................. 257/295; 257/535; 438/300
(58) Field of Classification Search ............... None
See application file for complete search history.

(56) References Cited

U.S. PATENT DOCUMENTS 5,717,635 A * 2/1998 Akatsu ............. 365/185.05
6,448,607 B1 * 9/2002 Hsu et al. ............... 257/315
6,972,226 B2 * 12/2005 Deppe et al. ............ 438/201
2004/0026745 A1    2/2004 Itoh et al.
2004/0262665 A1   12/2004 Iwata et al.

FOREIGN PATENT DOCUMENTS

| DE | 10039441 | 2/2002 |
| DE | 10129958 | 1/2003 |
| DE | 10204873 | 10/2003 |
| WO | WO 2004/053982 A3 | 6/2004 |

* cited by examiner

*Primary Examiner*—Leonardo Andujar
(74) *Attorney, Agent, or Firm*—Dicke, Billig & Czaja PLLC

(57) ABSTRACT

A semiconductor memory having charge trapping memory cells, where the direction of current flow of each channel region of the memory transistors runs transversely with respect to the relevant word line, the bit lines are arranged on the top side of the word lines and in a manner electrically insulated from the latter, and electrically conductive local interconnects of source-drain regions are present, which are arranged in sections in interspaces between the word lines and in a manner electrically insulated from the latter and connected to the bit lines, wherein gate electrodes are arranged in trenches at least partly formed in the memory substrate.

18 Claims, 17 Drawing Sheets

SEMICONDUCTOR MEMORY HAVING CHARGE TRAPPING MEMORY CELLS AND FABRICATION METHOD THEREOF

FIELD OF THE INVENTION

The invention relates to the field of electrically writable and erasable non-volatile flash memories. It particularly describes a non-volatile memory having charge trapping cells comprising a trapping dielectric particularly adapted to be used in a virtual ground NOR memory cell architecture.

BACKGROUND

A charge trapping semiconductor memory typically has an array of charge trapping memory cells arranged in columns and rows, where each one of the memory cells is structured as a transistor including a gate dielectric that typically consists of a charge trapping storage layer sandwiched in between two boundary layers. In general, storage layer materials have a smaller energy band gap and a larger trap density than boundary layer materials so that charge carriers trapped in the storage layer remain localized. Typically, nitrides are used as storage layer materials, while oxides are used as boundary layer materials. Depending on the actual configuration, charge carriers can be transferred from the channel region to the storage layer using channel hot electrons (CHE) or Fowler-Nordheim tunneling. Erasing a charge trapping memory cell may be effected by injecting hot holes or by Fowler-Nordheim tunneling.

In a typical common source memory cell architecture, conductive source lines connect source regions of a column and conductive word lines that are arranged in parallel alignment to the source lines connect gate electrodes of a column and are used to select a single memory cell. Conductive bit lines are arranged above the word and source lines orthogonally aligned therewith and are in electric contact with drain regions. Different therefrom, in a typical virtual ground architecture, bit lines are in electric contact with both source and drain regions, where every two adjacent bit lines are used for programming and sensing of a memory cell.

Document DE 10258194 A1 describes a semiconductor memory having charge trapping memory cells in virtual ground architecture, where directions of current flows through the channel regions are aligned vertically to word lines and bit lines are arranged above the word lines isolated therefrom. Local interconnects (jumper connections) are provided between the word lines isolated therefrom that are connected to the bit lines. With regard to a consecutive numbering of the storage transistors, these local interconnects on one side of a word line, respectively, electrically conductively connect a source/drain region of an even-numbered storage transistor with a source/drain region of a consecutive odd-numbered storage transistor, and, on the opposing side of that word line, these local interconnects respectively electrically conductively connect a source/drain region of an odd-numbered storage transistor with a source/drain region of a consecutive even-numbered storage transistor. Also, word lines can be contacted with word line straps to reduce resistivity thereof.

Charge trapping memory cells of above document DE 10258194 A1 are structured in planar configuration, in which, however, severe problems as to a further down-scale of the memory cells can arise. More particularly, scaling down the memory cells results in shorter and shorter lengths of channel regions that is to say distance of the regions in between source/drain regions, rendering a punch-through of the memory cells more likely. Otherwise, usage of the memory cells in a multi-bit storage mode essentially requiring localized charge distributions on drain-sides and source-sides of the storage layers of the memory cells may result in a detrimental overlap of charge distributions disabling a clear discrimination of logic states.

SUMMARY

The present invention provides a memory having charge trapping cells and method of making a memory having charge trapping cells. In one embodiment, the memory having charge trapping memory cells including a substrate, a plurality of conductive word lines, and a plurality of memory cells. The memory cells include a plurality of shallow trench isolations, a plurality of source/drain regions bounded by the shallow trench isolations, a plurality of gate electrodes formed by respective parts of the word lines opposing the substrate between adjacent source/drain regions to form a plurality of channel regions, the gate electrodes being isolated from the source/drain regions by a trapping dielectric. The gate electrodes are arranged in trenches at least partly formed in the substrate.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
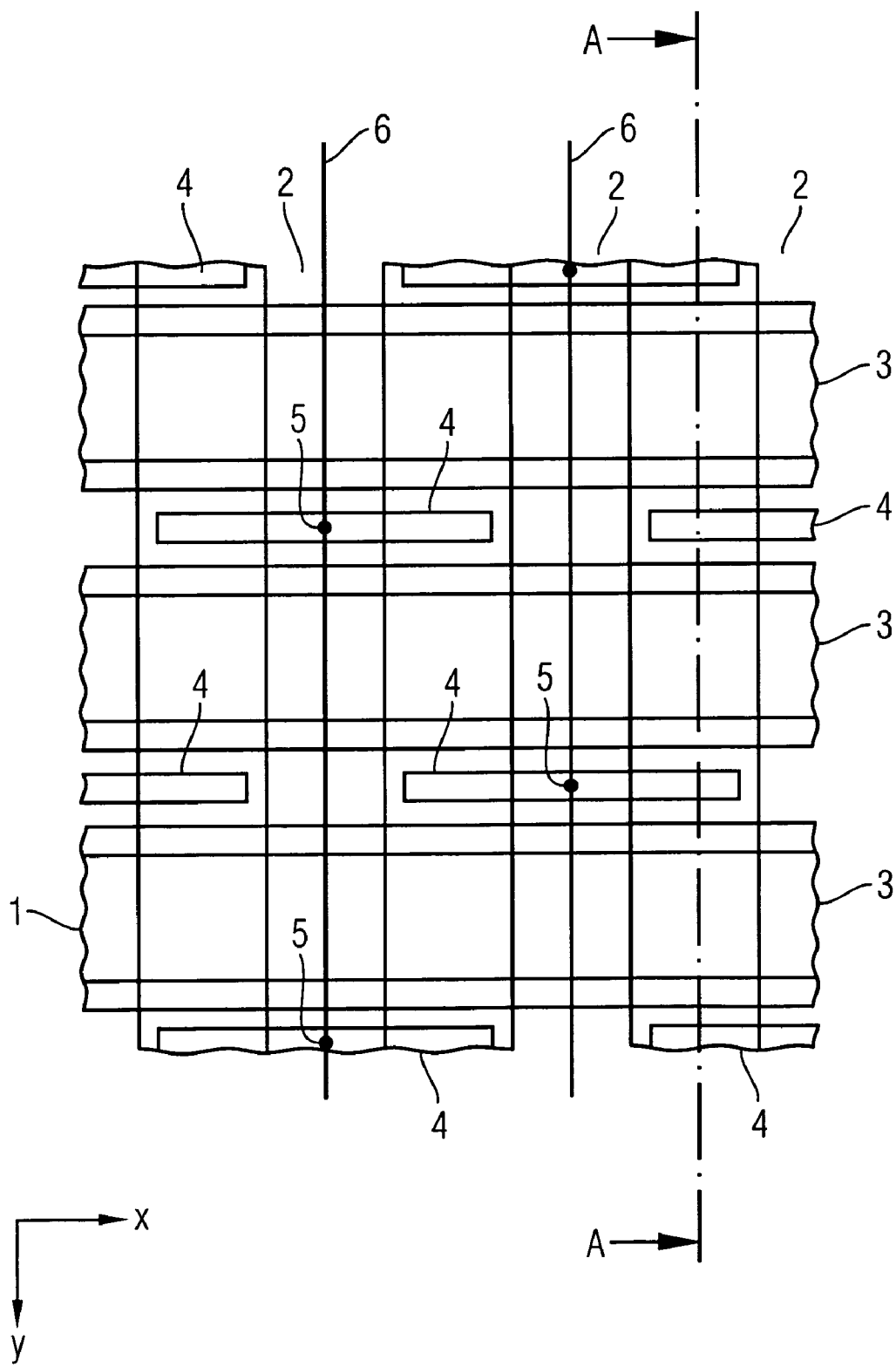
FIG. 1 illustrates schematically one embodiment of word lines and bit lines of memory.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides an improved charge trapping memory allowing a further down-scale without causing problems related with shrinking of the memory cells such as punch-through of the cells and discrimination of logic states in a multi-bit mode. The invention further provides an improved method for fabricating such charge trapping memory.

According to one embodiment of the invention, a semiconductor memory having charge trapping memory cells is given, which includes a substrate (or semiconductor body) having a first polarity in a cell array region that includes a plurality of shallow trench isolations (STIs) which are arranged substantially continuously along a first direction (y). Further, a plurality of conductive word lines is arranged along a second direction (x) transverse (typically in orthogonal alignment) to the first direction (y) that are isolated from the substrate. Regions of the substrate between adjacent word lines are implanted with an impurity having a second polarity (the second polarity is negative if the first polarity is positive, and vice versa), to thereby produce a plurality of implanted source/drain regions that are bounded by the shallow trench isolations aligned in the second direction (x). In a highly preferred realization of the source/drain regions these are arranged laterally adjacent the word lines.

In one embodiment of the semiconductor memory of the invention, a plurality of gate electrodes is provided (typically and preferably formed by respective parts of the word lines) that oppose the substrate at least in regions between adjacent source/drain regions to thereby form a plurality of channel regions to enable current flows between the source/drain regions. As typical in a charge trapping memory, the gate electrodes respectively are isolated from at least the source/drain regions by a trapping dielectric for trapping of electric charges (charge carriers) from their respective channel regions. In a possible realization of the memory that may be preferable, the gate electrodes are substantially completely isolated from the substrate by the storage layer (or alternatively trapping dielectric). The trapping dielectric is designed to be a three-layered structure that consists of a storage layer sandwiched in between two boundary layers, where the storage layer material in one embodiment is a nitride, particularly silicon nitride, especially in case of a silicon substrate, and, the boundary layers materials in one embodiment are oxides, particularly silicon oxide, especially in case of a silicon substrate.

In the semiconductor memory of the invention, the source/drain regions are arranged in alternating odd- and even-numbered columns along the first direction (y) and in alternating odd- and even-numbered rows along the second direction (x). Further, a plurality of electrically conductive local interconnects (or conductive cross connections or conductive jumper connections) that are provided substantially above the shallow trench isolations are electrically connecting respective pairs of the source/drain regions, where in consecutive numbering each pair of source/drain regions in an even-numbered row connects a source/drain region in an even-numbered column and an adjacent source/drain region in a subsequent odd-numbered column, and each pair of source/drain regions in an odd-numbered row connects a source/drain region in an odd-numbered column and an adjacent source/drain region in a subsequent even-numbered column. Further, a plurality of conductive bit lines are arranged along the first direction (y) above the local interconnects, where each one of the bit lines connects a plurality of local interconnects in either even-numbered or odd-numbered of the rows. A charge trapping memory is described in DE 10258194 A1 already mentioned in the introductory portion, the disclosure of which document is incorporated herein by reference.

According to a characterizing feature of the invention, the gate electrodes are arranged in trenches that are at least partly formed in the substrate. The gate electrodes are isolated from the substrate, and especially, at least are isolated from the source/drain regions by the storage layer (or alternatively trapping dielectric that preferably consists of a storage layer sandwiched in between two boundary layers). Hence, the trapping dielectric typically is arranged in the trenches located between the gate electrodes and (part(s) of) the substrate. In a highly preferred realization of the trenches, a section of the trenches along their depth in a direction in parallel alignment to the bit lines essentially is U-shaped.

The charge trapping memory of the present invention preferably is adapted to be symmetrically operated, where "symmetry" is seen to allow a symmetric operation of drain/source regions as is customary in two- (or multi-) bit memories.

Accordingly, it advantageously is possible to solve the problem of a narrow source/drain pitch particularly in a multi-bit device by enlarging the channel region length compared to the conventional case. In other words, recessed channel regions are used to obtain enlarged gate lengths compared to the planar case as disclosed in DE 10258194 A1. Particularly, such charge trapping memory allows to extend scalability of hot carrier programmed multi-bit devices into the 120 nm source/drain pitch regime, which is equivalent to a unit bit size of 0.006 $\mu m^2$ or 2.4 $F^2$ at 50 nm ground rule. Hence, an extension of scalability of a 4 $F^2$/2 bit cross-point device into at least the 50 nm range is enabled. Fabricating such memory is compatible with the high performance CMOS process without significant alterations which enables embedded products without performance loss. Since the concept features localized storage strips such that it may be operated by hot hole programming, low power programming can be achieved. This enables fast, low power data flash products which comply with an NAND benchmark.

According to one embodiment of a charge trapping memory according to the invention, the storage layer (or alternatively trapping dielectric) isolating each one of the gate electrodes in a trench from at least source/drain regions, includes at least two (separately arranged) parts that include a first part at least isolating the gate electrode from the source region (and not from the drain region) and a second part at least isolating the gate electrode from the drain region (and not from the source region). As has been found, particularly in a long-term usage of the memory cells, charge carriers may permanently accumulate especially in between those regions isolating the gate electrode from the source/drain regions, which may seriously inhibit a clear discrimination of charge carrier distributions on the source side or on the drain side of the storage layer. Hence, above-described structure of the storage layer (or alternatively trapping dielectric) advantageously enables to clearly discriminate charge distributions on the storage layer. Providing such storage layer consisting of a plurality of parts (especially of two parts) is preferably realized in removing a bottom part of the storage layer located at the bottom of the trench. Hence, the first and second parts of the storage layer (or alternatively trapping dielectric) mainly are located on the walls of a trench.

In one embodiment of a memory of the invention, the first and second parts of the storage layer (or alternatively trapping dielectric) are arranged such that at least 30%, even more preferably at least 20%, of a length of each one of the channel regions in between the source/drain regions is free of the storage layer (or alternatively trapping dielectric), that is to say is not opposed by the storage layer (has no overlap therewith). In other words, at least 20% or more preferable at least 30% of each channel region is not isolated from the gate electrode by the storage layer (or alternatively trapping dielectric) but by another dielectric. Such construction is very advantageous with regard to the above-described clear discrimination of charge carrier distributions on the storage layer.

In another embodiment of the memory of the invention, each one of the channel regions facing its respective gate electrode includes at least one (concavely or in an outwards direction) curved region. Hence, a width of the channel region in a direction perpendicular to a line connecting the corresponding source/drain regions adjacent the channel region is enlarged resulting in a rather homogeneous distribution of radially directed electric fields avoiding detrimental field peaks at edges of the channel region.

In one embodiment, the semiconductor memory according to the invention is operated as a virtual ground memory cell array. It particularly may be preferable to adapt it to be operated as a virtual ground NOR memory cell array. Also, the memory of the invention preferably is used as a multi-bit memory cell memory, especially two-bit memory cell memory.

According to another embodiment of the invention, a method for fabricating a semiconductor memory having charge trapping cells as above described is given. The method comprises providing a substrate having a first polarity in a cell array region; forming of shallow trench isolations in parallel alignment at a distance of one to another in the substrate; forming of a layered structure comprising a sacrificial mask layer, e.g., polysilicon, above the substrate; etching of word line trenches in the sacrificial mask layer and substrate in orthogonal alignment as to the shallow trench isolations; growing of a tunneling dielectric oxide layer in the word line trenches and depositing of a charge trapping storage layer on the tunneling dielectric oxide layer; depositing of a gate dielectric on top of the storage layer; depositing of at least one gate conductor material in the word line trenches and back-etch of the gate conductor materials to form recessed portions; depositing of an electrically insulating material on the gate conductor materials; forming of local interconnect isolations; etching of local interconnect openings; forming of source/drain regions having a second polarity; filling of local interconnect openings with electrically conductive material; and forming of electrically conductive bit lines in parallel alignment as to the shallow trench isolations.

Etching of the word line trenches may be performed as a multi-step process typically by changing etch chemistry. Preferably, at first the sacrificial mask layer is etched, followed by forming a recess in the substrate, which allows a very accurate control of word line trench depth and/or shape.

Further, the storage layer may be patterned or not. Patterning of the storage layer may for instance comprise depositing a conformal masking layer, then coating of an organic masking resist onto the masking layer followed by a recessing of the organic masking resist, and removal of the open parts of the masking layer to form sidewall spacers out of the masking layer. Alternatively, a deposition of the conformal masking layer, solely followed by an etching of the masking layer to form sidewall spacers out of the masking layer may be performed.

Depositing the gate conductor material may be effected in two variants: a first variant, where a first gate conductor material and a second gate conductor material are deposited on the gate dielectric, wherein the first gate conductor material is conformally deposited on the gate dielectric to form a groove for depositing the second gate conductor material. And, alternatively, a second variant, where the first gate conductor material is deposited on the gate dielectric and then recessed to form a recess in the word line trench for depositing the second gate conductor material.

Embodiments of the semiconductor memory and the fabrication method thereof will be described in detail below with reference to the accompanying drawings, where like designations denote like elements. In order to avoid unnessecary repetitions, only differences between figures are explained.

Now referring to FIG. 1, an arrangement scheme (or layout) of the word lines and bit lines of the semiconductor memory of the invention having charge trapping memory cells in a virtual ground NOR architecture is described. FIG. 1 illustrates a plan view of a scheme revealing the positions of word lines 3 and bit lines 2 applied above the word lines 3 on a semiconductor substrate 1 (for instance silicon) of a first polarity, and the regions that are to be electrically conductively connected to one another. Apparently, bit lines 2 and word lines 3 are arranged crossing at right angles. STIs (shallow trench isolations) 12 that are not visible in FIG. 1 are arranged parallel to one another in parallel alignment to the bit lines 2 beneath the bit lines 2 and word lines 3. Active areas (not visible in FIG. 1) are arranged beneath the bit lines 2 and word lines 3. While not visible in FIG. 1, both STIs 12 and active areas may be seen to be bounded by boundaries 33 of bit lines 2 indicated in FIG. 1.

Between STIs 12 channel regions of the transistors are provided respectively having a direction of current flow that runs parallel to the isolation trenches below each word line 3. The word lines 3 therefore run over the direction of current flow of the channel regions arranged transversely with respect to the longitudinal direction of the word lines.

The source/drain regions (not visible in FIG. 1) 31 of the transistors are in each case present in a manner laterally adjoining the word lines. The source/drain regions are electrically conductively connected to one another by local interconnects 4, bridging a short piece of the relevant isolation trench in each case. The local interconnects 4 cross-connecting source/drain regions are contact-connected by the bit lines 2 in contacts 5. In FIG. 1, a symbolic line 6 is drawn through bit lines 2 connecting contacts 5 just for the purpose of a better illustration of contact-connections between bit lines 2 and contacts 5.

While not illustrated in the plan view of FIG. 1, word line straps that are contact-connected on the top side of the word lines 3 and are arranged above the bit lines 2 may be arranged, which serve for further reducing the electrical bulk resistance of the word lines 3. The bit lines 2 are electrically insulated both from the word lines 3 and from the word line straps.

The more precise structure of this exemplary embodiment of the semiconductor memory will be explained with reference to the following figures illustrating a preferred fabrication method and variants thereof.

Figure 2:
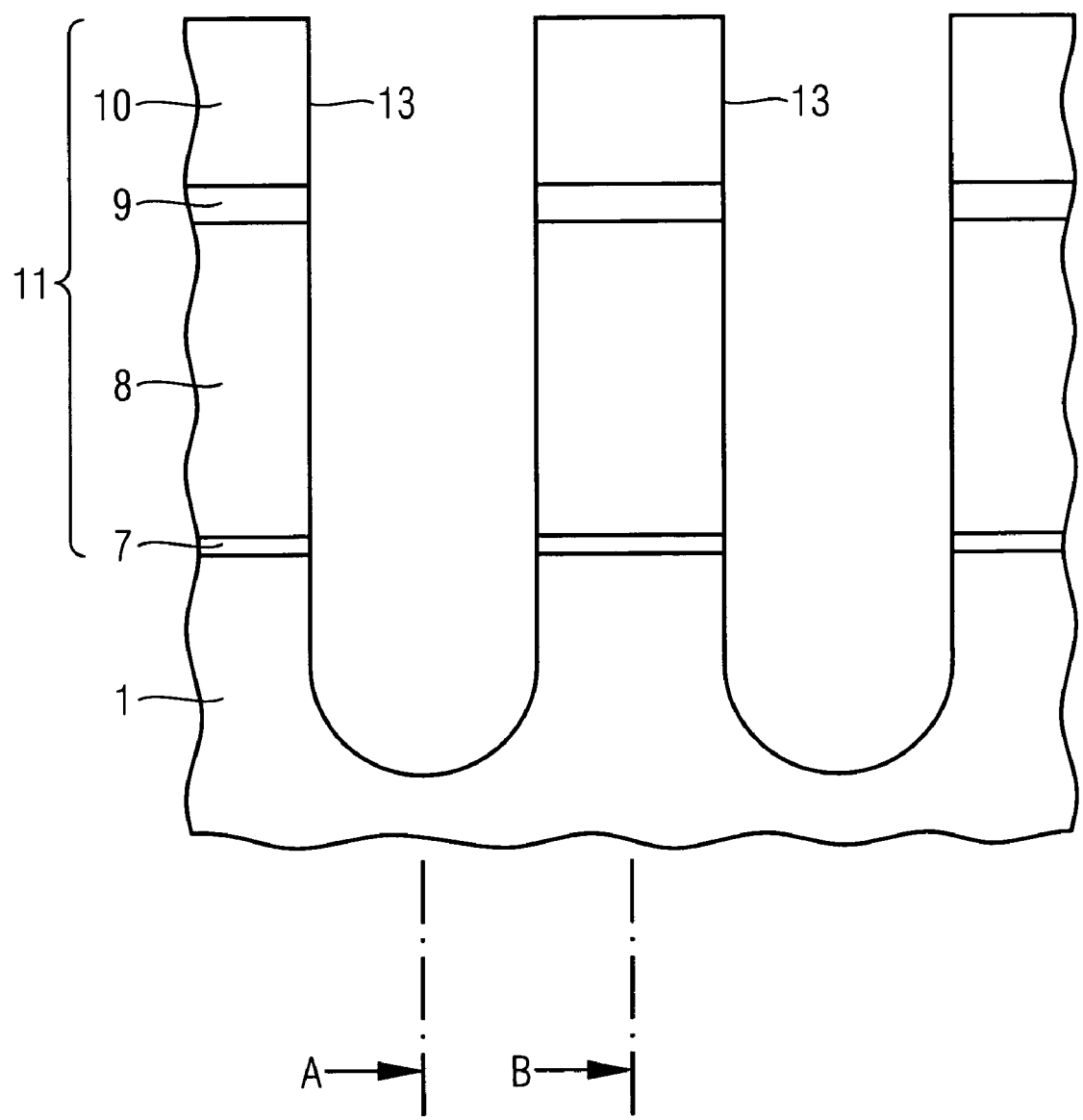
FIG. 2 illustrates a detail from one embodiment of an intermediate product of a fabrication method in a cross section along the bit lines to be fabricated as indicated by line A-A in FIG. 1.

FIG. 2 illustrates a detail from an intermediate product of the semiconductor memory in cross section along a bit line to be fabricated as indicated by line A-A in FIG. 1. Starting with providing a substrate 1, for instance a silicon substrate, having a first polarity (for instance p) in a cell array region, shallow trench isolations 12 (not illustrated in FIG. 2) are formed using a customary technique such as applying a pad oxide layer and a pad nitride layer on top of the pad oxide layer and structuring the pad nitride layer to use it as a mask for etching the isolation trenches. Accordingly, the isolation trenches are fabricated at a top side of the substrate 1 or semiconductor body which are arranged parallel at a distance from one another and are preferably filled with an oxide of the semiconductor material. However, there may also be a different dielectric in the isolation trenches. Pad oxide and pad nitride layers are removed after filling the isolation trenches. Usually, wells are fabricated by appropriate implantation and annealing steps.

Next, after appropriate cleaning procedures, there follows a deposition of a CMOS gate stack 11 on top of the top side of the substrate 1 or semiconductor body. The CMOS gate stack which advantageously is designed to be used for peripheral transistor elements of memory chip periphery to be fabricated using customary CMOS processing comprises an oxide layer 7, preferably a thermal oxide layer to be used as gate oxide for CMOS, formed on top of the substrate 1, a sacrificial layer 8 which is preferably polysilicon formed on top of the oxide layer 7 for instance by chemical vapor deposition (CVD), and, a first hard mask layer 9 made of electrically insulating material, for instance an oxide layer, formed on the polysilicon layer 8, for instance by CVD, and a second hard mask layer 10 made of electrically insulating material, for instance a nitride layer or alternatively a carbon layer formed on top of the first hard mask layer 9, for instance by CVD, that is suitably used for subsequent chemical-mechanical polishing (CMP). While not shown in FIG. 2, a further hard mask layer made of an alternative material, for instance made of carbon, may also be applied on top of the second hard mask layer. As already mentioned, periphery transistor gate stack 11 may advantageously be used as a mask or sacrificial layer for fabricating storage transistor structures instead of a polycid layer as may be used. Then, hard mask 10 is patterned in strip form in order to thus be able to pattern the word line trenches 13 into the gate stack layered structure and substrate. More particularly, word line trenches 13 typically are etched in a multi-phase process at least comprising a first step where etching stops at gate oxide layer 7 and a second step where a recess is etched into the substrate 1 enabling a very accurate control of etching of word line trench 13 depth and shape.

Figure 3:
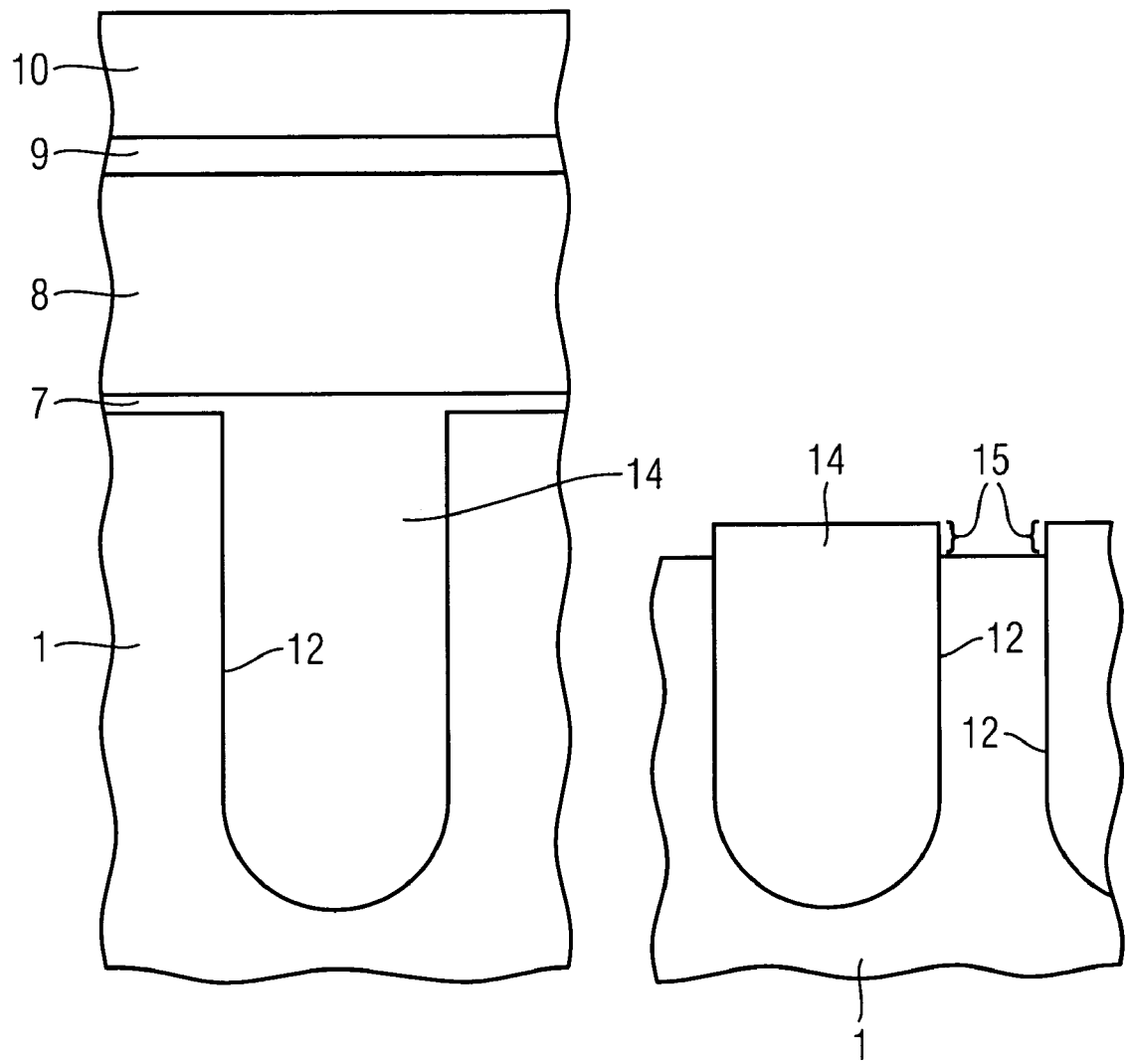
FIGS. 3A and 3B illustrate one embodiment of a detail from the intermediate product of FIG. 2 in a cross section along the word lines to be fabricated as indicated by lines A and B in FIG. 2.

FIGS. 3A and 3B illustrate a detail from the intermediate product of FIG. 2 in a cross section along the word lines to be fabricated as indicated by lines A and B in FIG. 2, where FIG. 3A corresponds to line A in FIG. 2 and FIG. 3B corresponds to line B in FIG. 2. Accordingly, in FIG. 3A, a sectional view along a word line trench, STIs 12 filled with electrically insulating material 14 are illustrated, where etching of the word line trenches 13 is such that each trench isolating material 14 projects from its trench 13 to result in a "step 15"-like structure. Alternatively, while not illustrated but being even more preferred, each trench isolating material 14 may be recessed as to its trench (downward step or recess) typically resulting in a very advantageous concave curvature of active regions (later channel regions) in between STIs 12 (which is a consequence of the very small channel region length) thus enabling a rather homogenous electric field distribution and avoiding detrimental field peaks at later channel region edges. In other words, a width of the channel region in a direction perpendicular to a line connecting the corresponding source/drain regions to be fabricated adjacent the channel region is enlarged by concave curvature. FIG. 3B illustrates a sectional view between adjacent word line trenches, where STIs 12 filled with electrically insulating material 14 remain unchanged.

Figure 4:
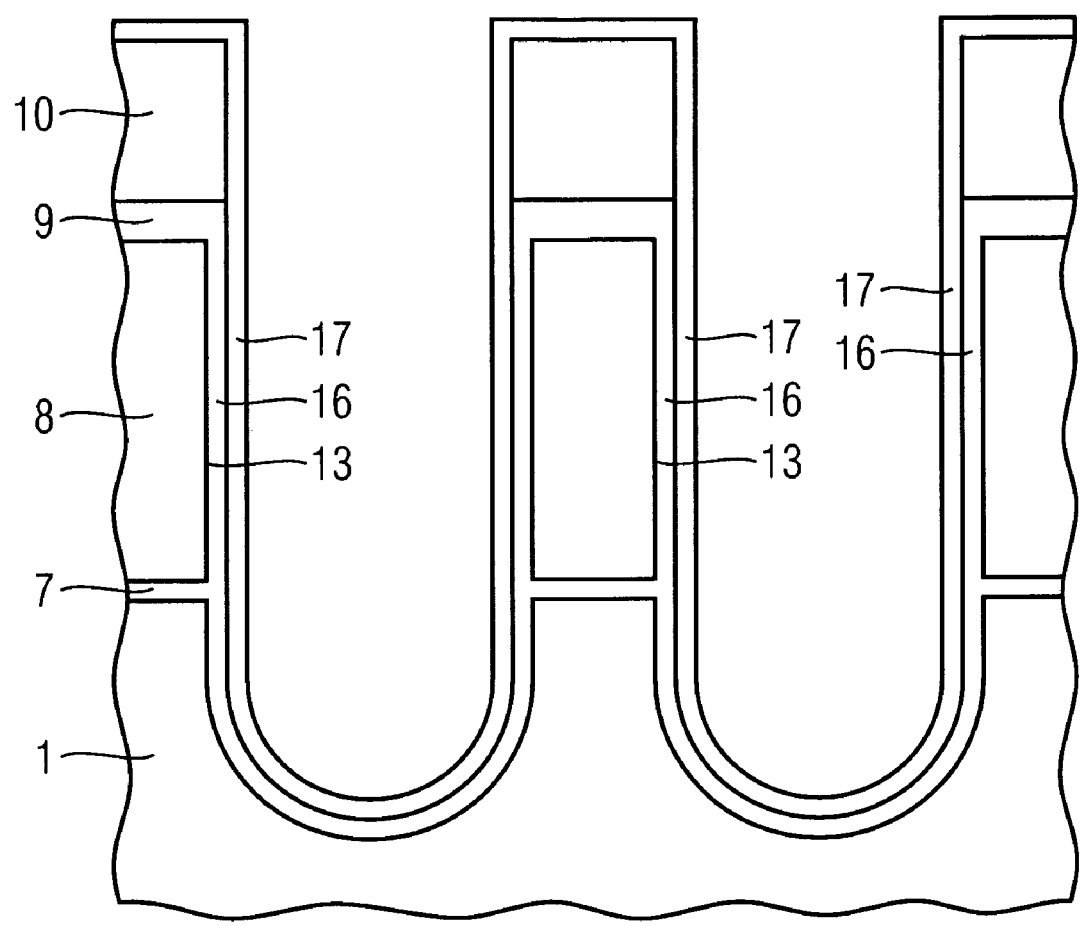
FIG. 4 illustrates one embodiment of a detail from another intermediate product of a fabrication method in a cross section along the bit lines to be fabricated as indicated by line A-A in FIG. 1.

FIG. 4 illustrates a detail from another intermediate product of a fabrication method in a cross section along the bit lines to be fabricated as indicated by line A-A in FIG. 1.

While not illustrated in FIG. 4, at first a sacrificial (thermal) oxide layer may be grown in trenches 13 to remove etch damage resulting in a very homogenous non-disturbed trench 13 surface, which sacrificial oxide layer can be etched wet-chemically. Then, a trench 13 bottom-side thermal oxide layer 16 is grown adapted to be used as tunneling dielectric for instance having a thickness of about 4 nm. On top of the oxide layer 16 a charge trapping storage layer 17, e.g., a nitride layer, is deposited, for instance by low pressure-CVD.

Figure 5:
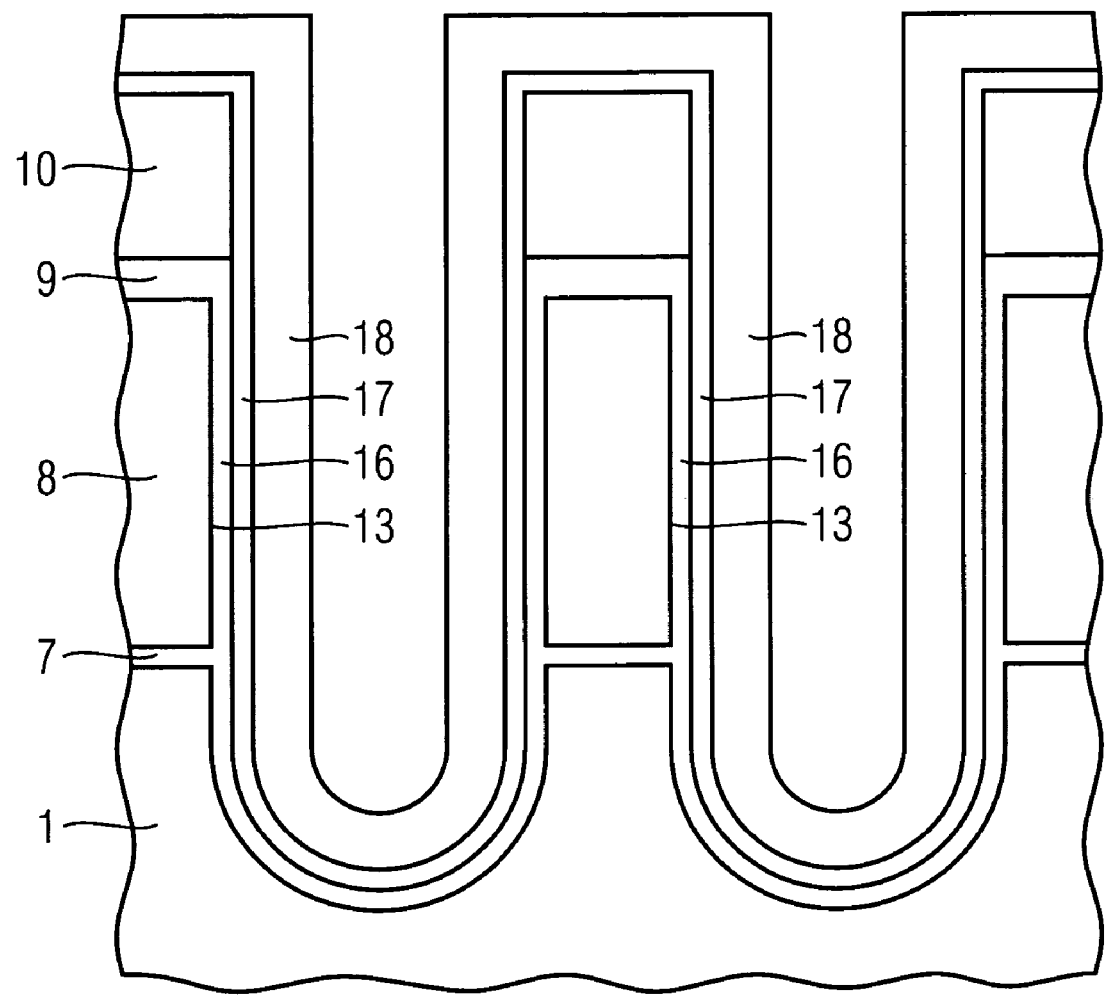
FIG. 5 illustrates one embodiment of a detail from another intermediate product of a fabrication method in a cross section along the bit lines to be fabricated as indicated by line A-A in FIG. 1.
Figure 6:
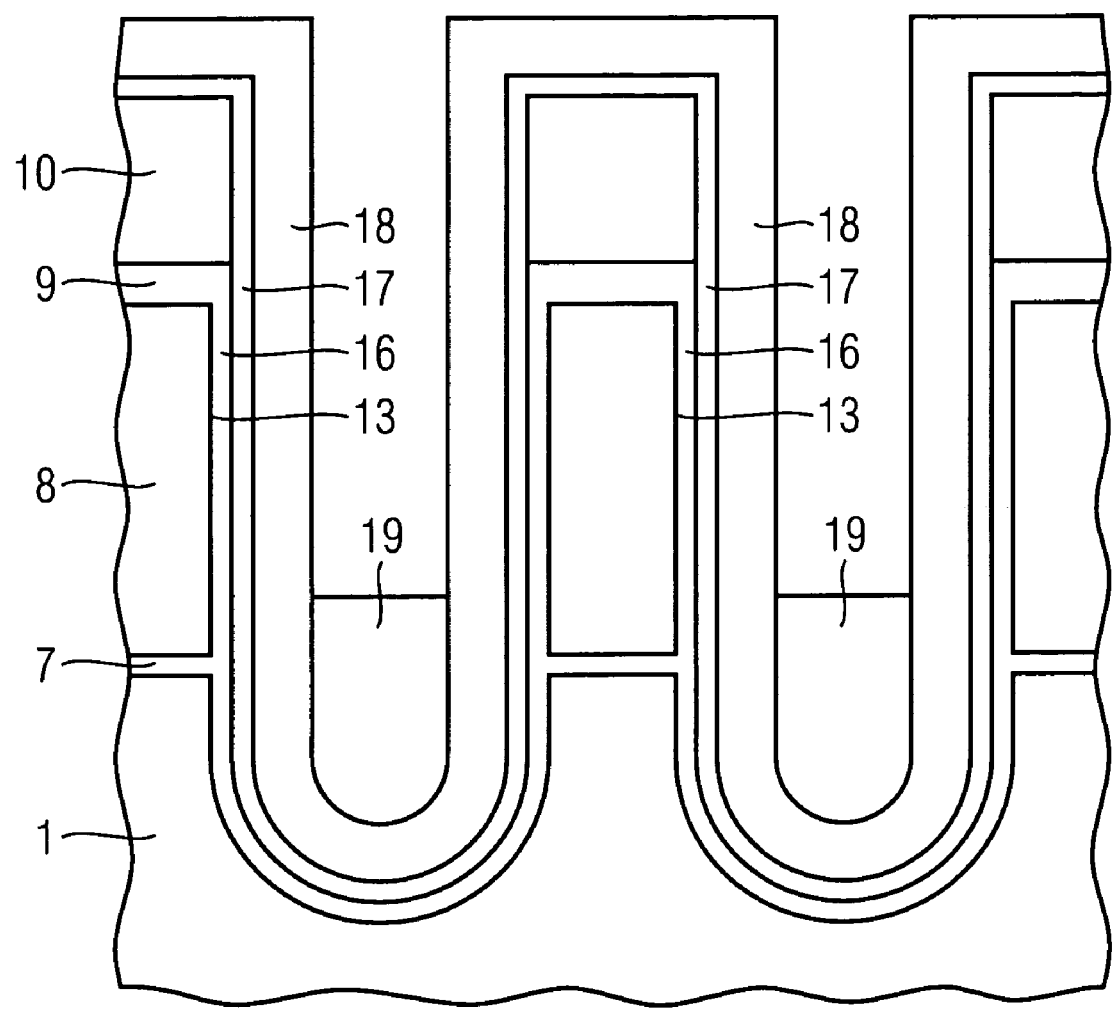
FIG. 6 illustrates one embodiment of a detail from another intermediate product of a first variant of structuring the masking layer of a fabrication method in a cross section along the bit lines to be fabricated as indicated by line A-A in FIG. 1.
Figure 7:
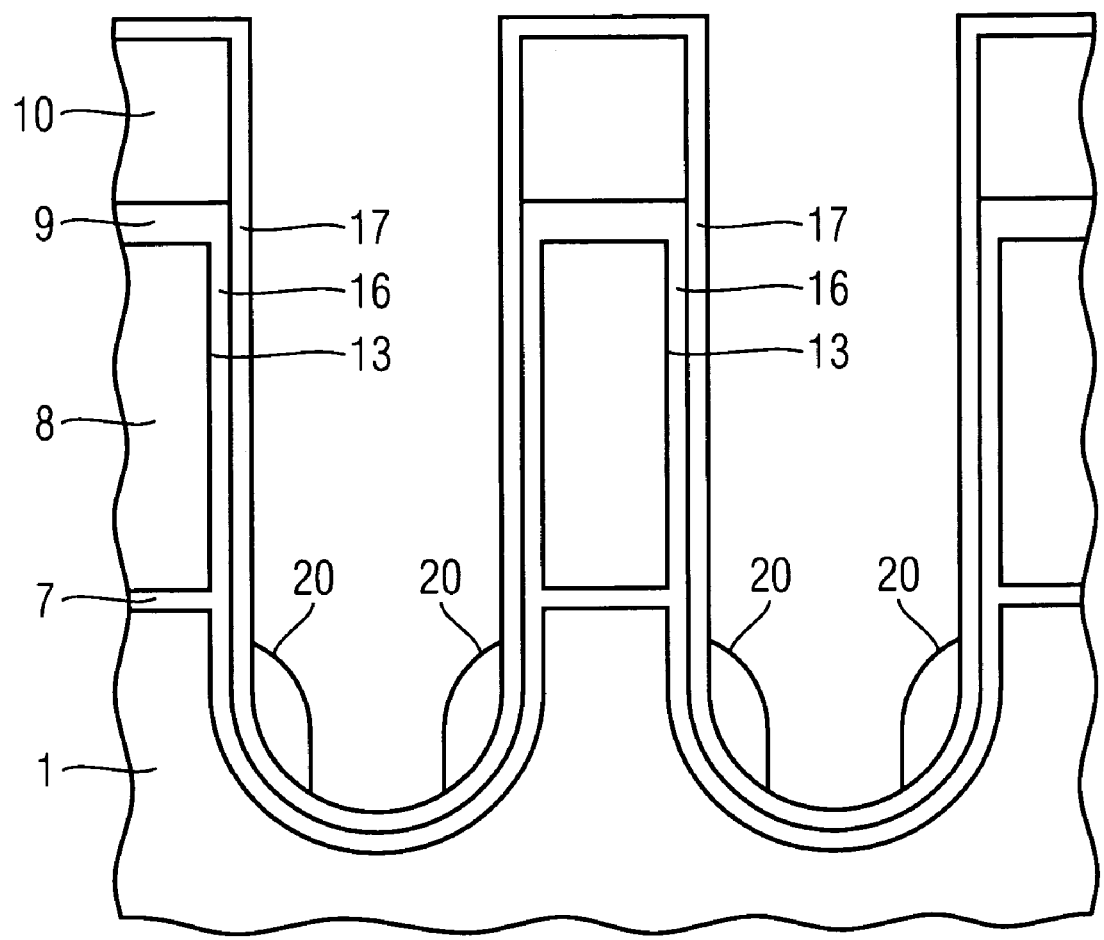
FIG. 7 illustrates one embodiment of a detail from another intermediate product of the first variant of structuring the masking layer of a fabrication method in a cross section along the bit lines to be fabricated as indicated by line A-A in FIG. 1.

FIG. 5 illustrates a detail from another intermediate product of a fabrication method in a cross section along the bit lines to be fabricated as indicated by line A-A in FIG. 1, and FIGS. 6 and 7 respectively illustrate a detail from a fourth and fifth intermediate product of a first variant of structuring the masking layer in FIG. 5. Accordingly, in FIG. 5, a conformally deposited masking layer 18 for masking the storage layer 17 is applied onto the storage layer 17. The masking layer 18 may for instance be made of polysilicon or carbon, however, each other material can be used as long as masking of the storage layer during a subsequent etching of the storage layer is achieved.

Next, in FIG. 6, an organic masking resist layer 19 (for example photoresist) is deposited onto the conformal masking layer 18, e.g., by a spin-coating technique that, after deposition is recessed for instance by using reactive ion etching (RIE).

Then, in FIG. 7, open parts of the masking layer 18 that are not covered by the organic masking resist layer 19 are removed by isotropic etching, subsequent removal of the resist and an unisotropic etching step to allow to form sidewall spacers 20 of the masking layer 18 material. Using an organic masking resist layer 19 has the advantage of fabricating small-sized side wall spacers 20, for instance essentially being located in the trench recess formed in the substrate 1. Otherwise, such organic masking resist layer 19 advantageously is likely to reduce etch damage of the trench bottom etching the masking layer 18, since RIE of the masking layer is kept at a minimum.

Figure 8:
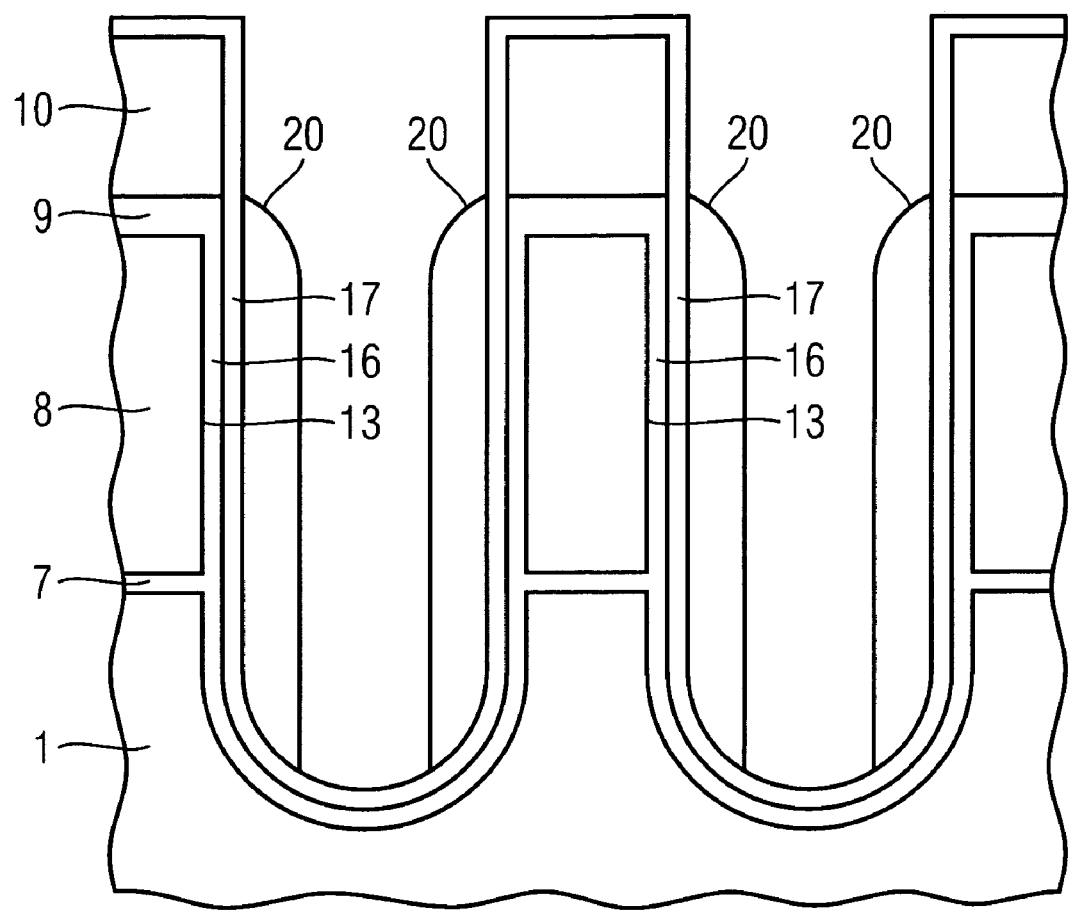
FIG. 8 illustrates one embodiment of a detail from another intermediate product of a second variant of structuring the masking layer of a fabrication method in a cross section along the bit lines to be fabricated as indicated by line A-A in FIG. 1.

FIG. 8 illustrates a detail from another intermediate product of a second variant of patterning the masking layer of FIG. 5 in a cross section along the bit lines to be fabricated as indicated by line A-A in FIG. 1. In FIG. 8, larger sidewall spacers 20 compared to the sidewall spacers 20 of FIG. 5C have been formed using RIE of masking layer 18 only that is to say without applying of an organic masking resist layer.

Figure 9:
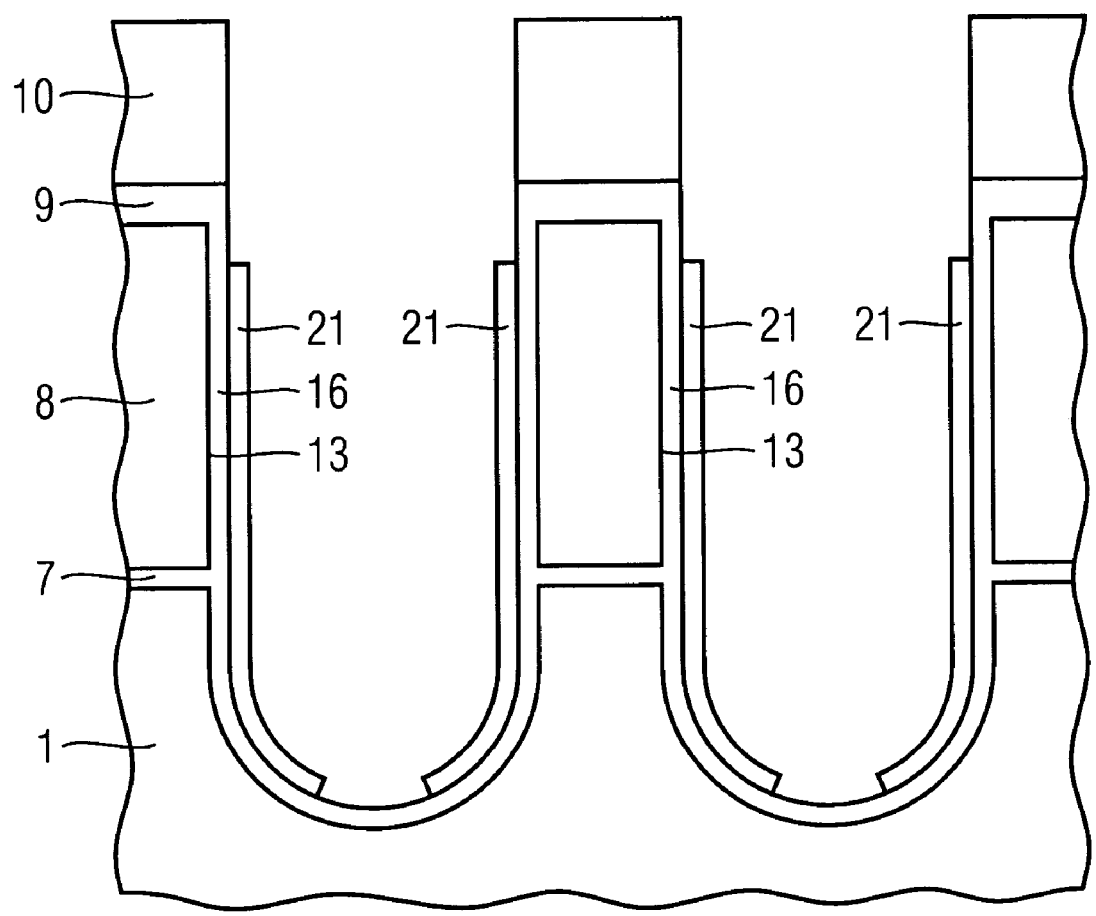
FIG. 9 illustrates one embodiment of a detail from another intermediate product of the second variant of structuring the masking layer of a fabrication method in a cross section along the bit lines to be fabricated as indicated by line A-A in FIG. 1.

FIG. 9 illustrates a detail from another intermediate product of the second variant of patterning the masking layer along the bit lines to be fabricated as indicated by line A-A in FIG. 1. All steps illustrated with regard to FIG. 9 and further figures may also be affected in the first variant of patterning the masking layer resulting in smaller sidewall spacers. Accordingly, in FIG. 9, unprotected portions of the charge trapping storage layer 17 are removed (for instance by etching with hot phosphoric acid) to result in separated first and second parts 21 of the storage layer 17, where a part of the storage layer 17 located at a bottom of the trench 13 has been removed. Afterwards, any residual masking layer is removed, e.g., by isotropic dry-etching or wet-chemical etching.

Figure 10:
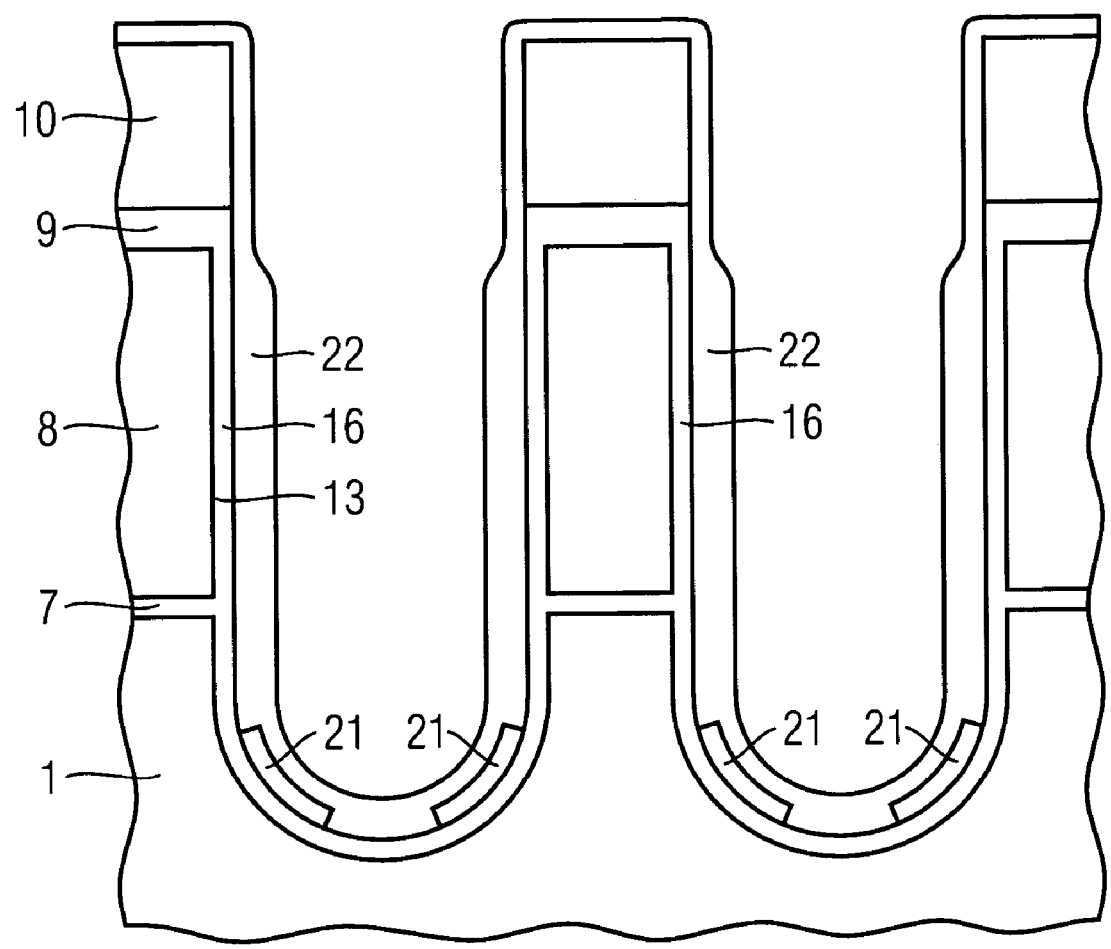
FIG. 10 illustrates one embodiment of a detail from another intermediate product following the first variant of structuring the masking layer of a fabrication method in a cross section along the bit lines to be fabricated as indicated by line A-A in FIG. 1.

FIG. 10 illustrates a detail from another intermediate product following the first variant of structuring the masking layer of a fabrication method in a cross section along the bit lines to be fabricated as indicated by line A-A in FIG. 1. In FIG. 10, a top boundary layer (gate dielectric) 22 is deposited/grown on top of the storage layer parts 21. The top boundary layer 22 preferably by a two-step process comprising forming of a high-temperature oxide and forming of a thermal oxide. Taking advantage of much higher growth rate of oxide on silicon compared to nitride, an appropriate thickness of the boundary layer above trench 13 bottom may be achieved as desired resulting in rather advantageous effects especially in writing characteristics and data retention of the storage transistor.

Figure 11:
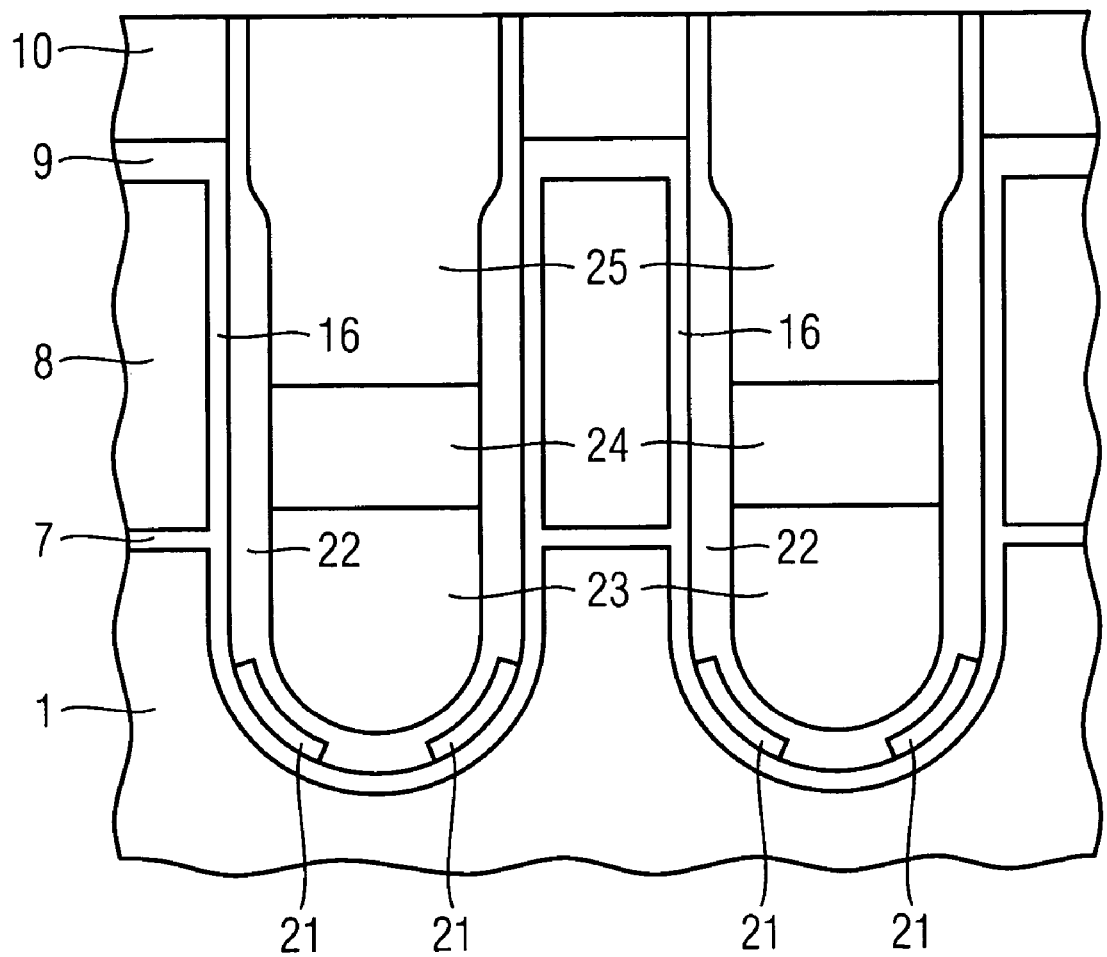
FIG. 11 illustrates one embodiment of a detail from another intermediate product according to a first variant of depositing a gate conductive material following the first variant of structuring the masking layer of a fabrication method in a cross section along the bit lines to be fabricated as indicated by line A-A in FIG. 1.

FIG. 11 illustrates a detail from another intermediate product according to a first variant of depositing a gate conductive material following the first variant of structuring the masking layer of a fabrication method in a cross section along the bit lines to be fabricated as indicated by line A-A in FIG. 1. In FIG. 11, a first gate conductor 23 (electrically conductive material), for instance polysilicon or amorphous silicon, has been deposited and recessed in the word line trenches 13, followed by depositing and recessing of a second gate conductor 24 (electrically conductive material), for instance WSi, WN/W or TiN, in order to reduce electric resistance of the first gate conductor 23, which is followed by a deposition of an electrically insulating material onto the second gate conductor 24 that is chemically-mechanically polished to fabricate a plane surface of trenches 13. Alternatively, a metal gate structure may be used which consists of one conductor only (e.g., TiN).

Figure 12:
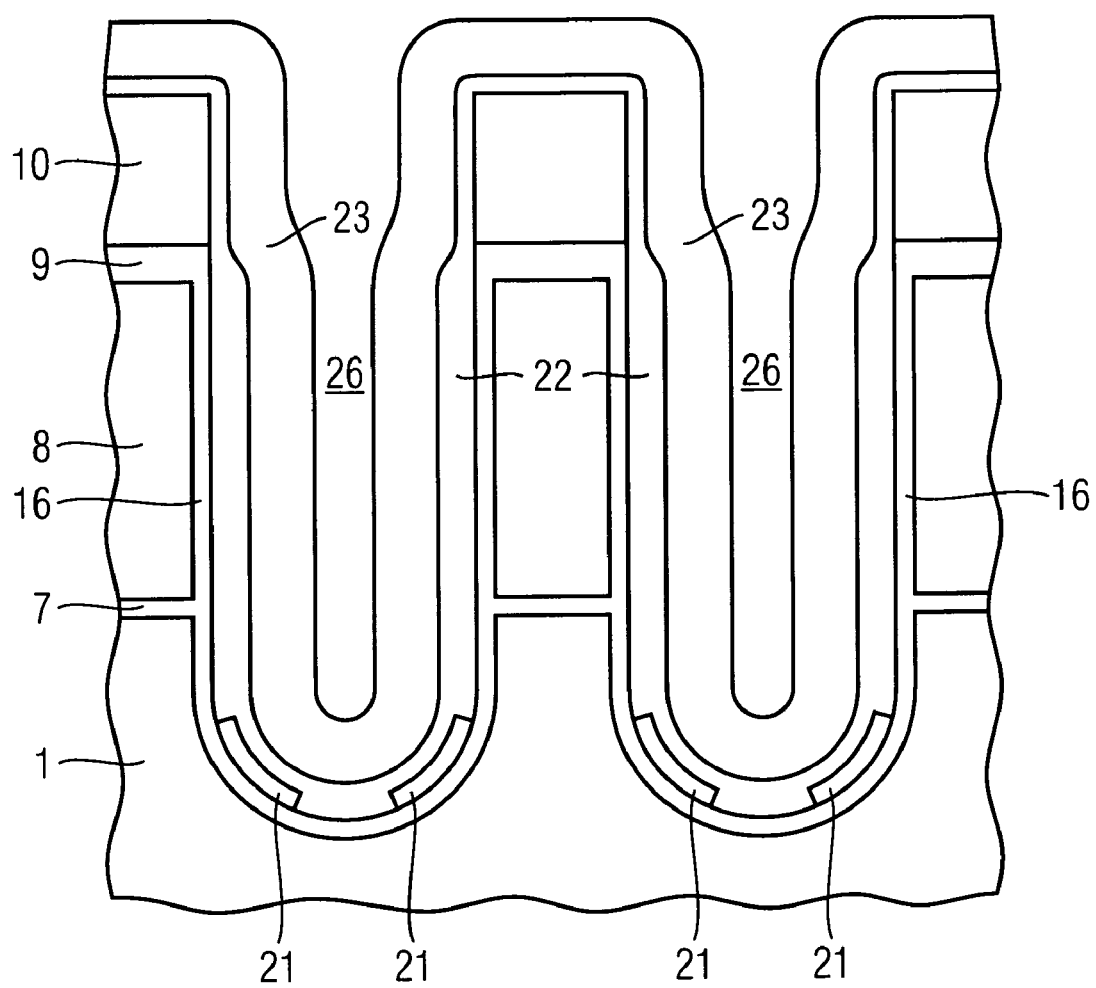
FIG. 12 illustrates one embodiment of a detail from another intermediate product according to a second variant of depositing a gate conductive material following the first variant of structuring the masking layer of a fabrication method in a cross section along the bit lines to be fabricated as indicated by line A-A in FIG. 1.

FIG. 12 illustrates a detail from another intermediate product according to a second variant of depositing a gate conductive material following the first variant of structuring the masking layer of a fabrication method in a cross section along the bit lines to be fabricated as indicated by line A-A in FIG. 1. In FIG. 12, a first gate conductor 23 (electrically conductive material), for instance polysilicon or amorphous silicon, has been conformally deposited in the word line trenches 13 thus forming a groove 26.

Figure 13:
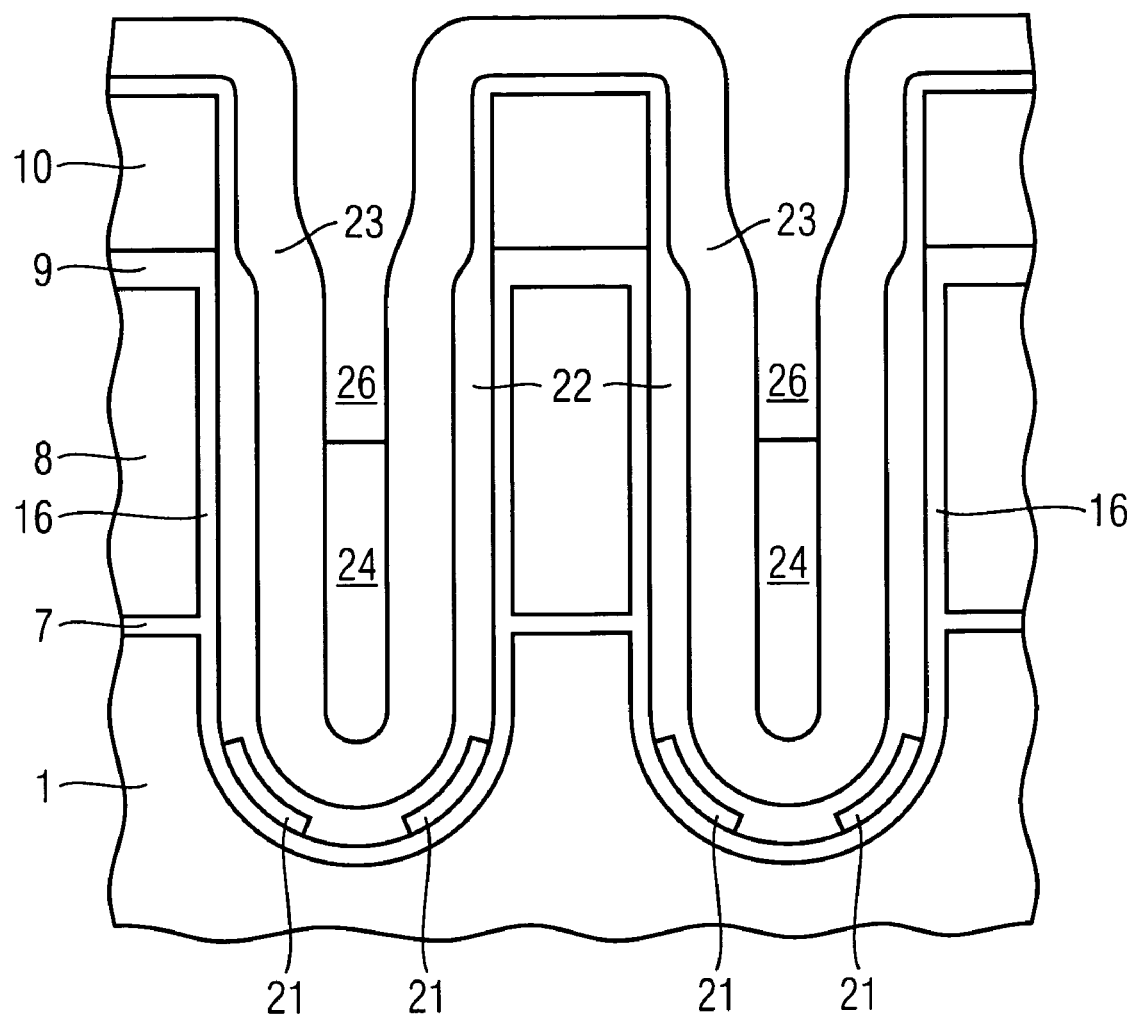
FIG. 13 illustrates one embodiment of a detail from another intermediate product according to the second variant of FIG. 12.

FIG. 13 illustrates a detail from another intermediate product according to the second embodiment of FIG. 12 where a second gate conductor 24 (electrically conductive material), for instance WSi, WN/W or TiN, for instance by CVD, in order to reduce electric resistance of the first gate conductor 23 has been deposited and recessed for instance by anisotropic RIE.

Figure 14:
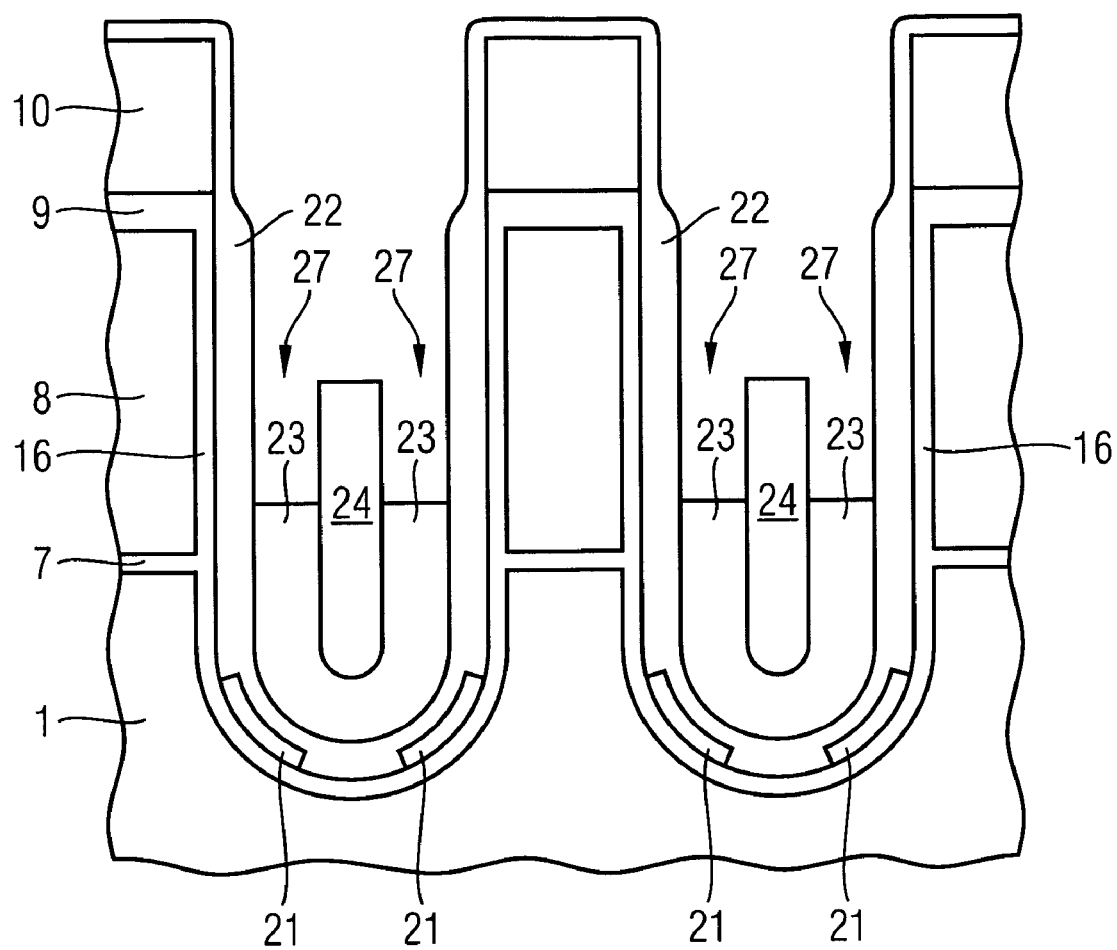
FIG. 14 illustrates one embodiment of a detail from another intermediate product according to the second variant of FIG. 13.

FIG. 14 illustrates a detail from another intermediate product according to the second embodiment of FIG. 13 where the first gate conductor 23 has been back-etched for instance by isotropic RIE or wet-chemical etching.

Figure 15:
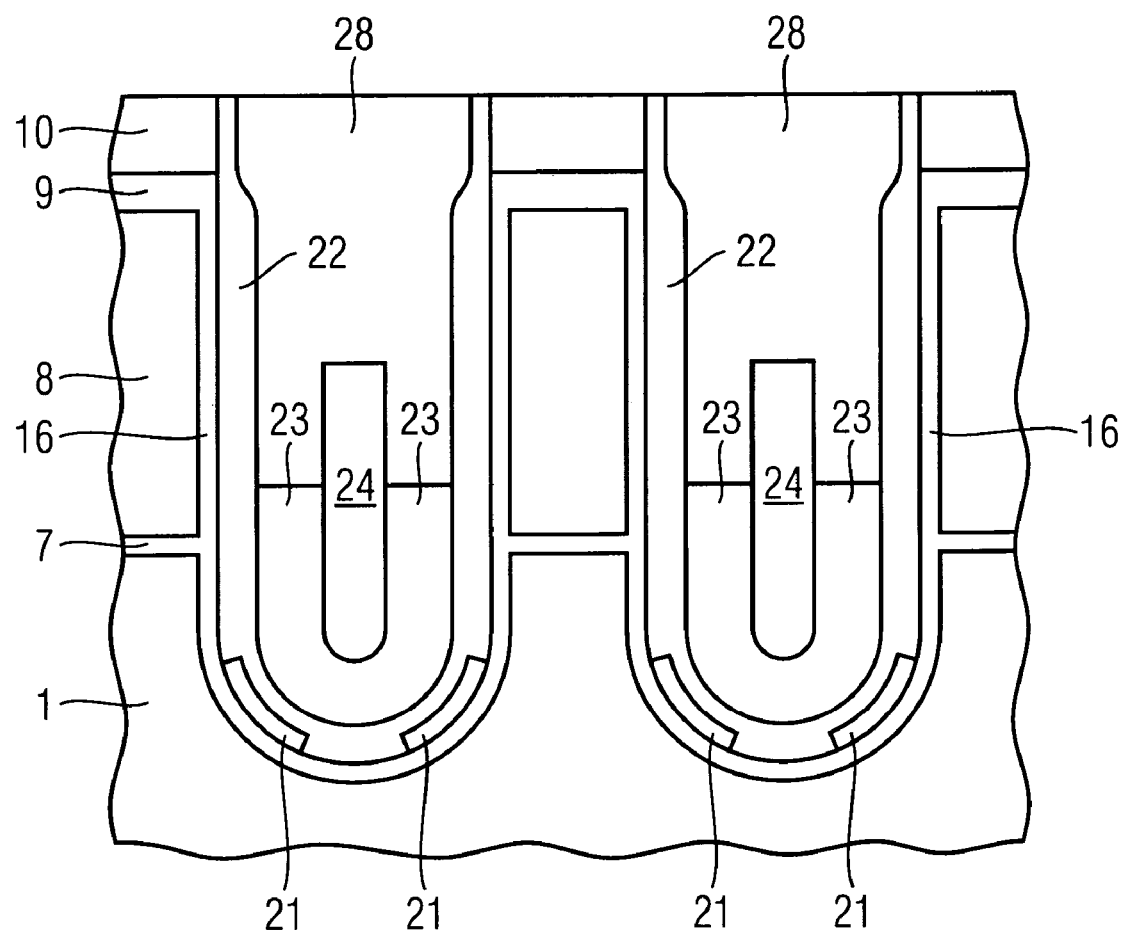
FIG. 15 illustrates one embodiment of a detail from another intermediate product according to the second variant of FIG. 14.

FIG. 15 illustrates a detail from another intermediate product according to the second embodiment of FIG. 14 where an isolation dielectric 25, e.g., silicon dioxide, has been deposited into the recessed portions created by back-etching of the first gate conductor 23, followed by a chemical-mechanical polishing to planarize the trenches.

Figure 16:
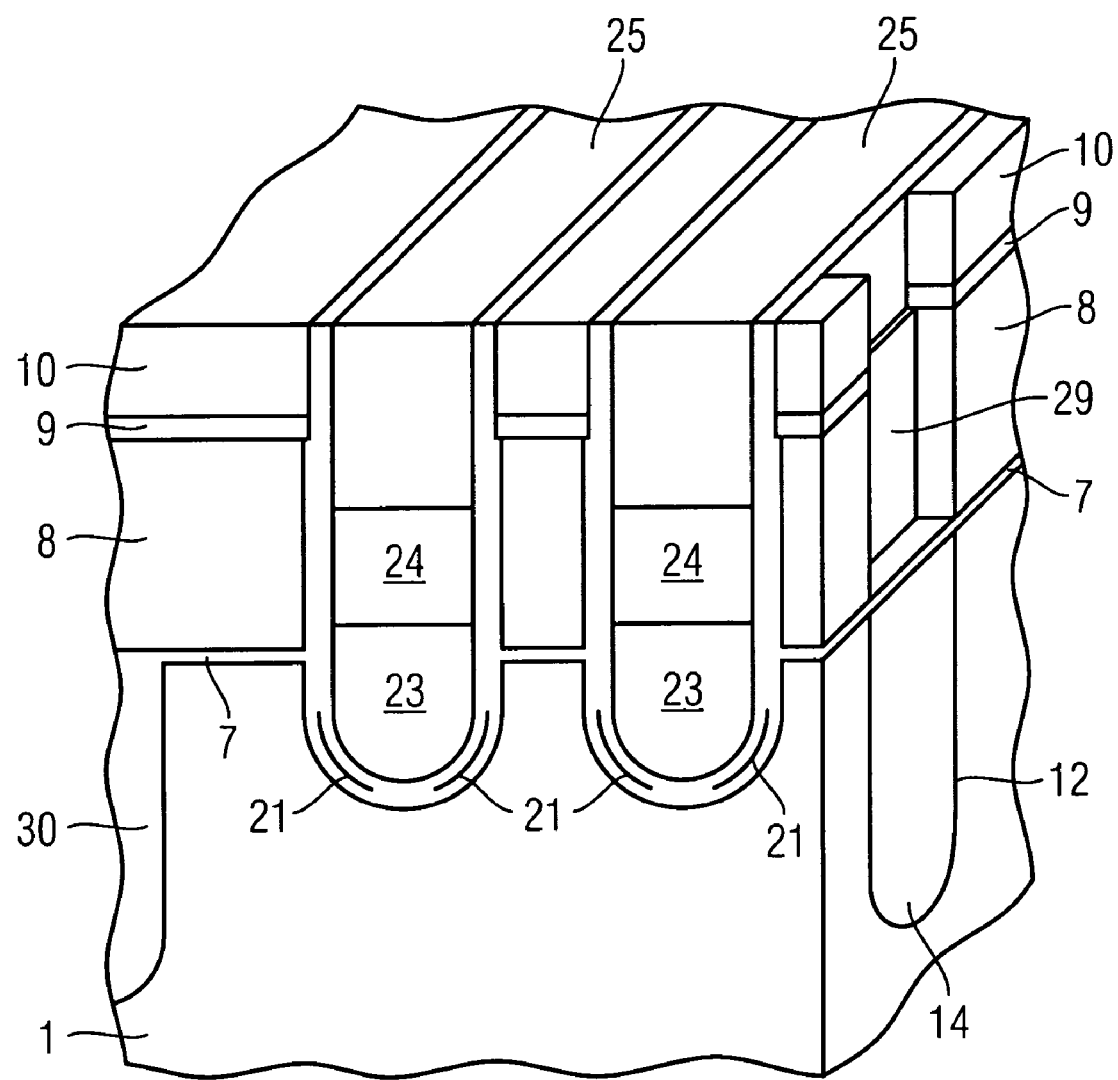
FIG. 16 illustrates one embodiment of a perspective view of a detail from another intermediate product according to the first variant of depositing a gate conductive material as shown in FIG. 11.

FIG. 16 illustrates a perspective view of a detail from another intermediate product according to the first embodiment of depositing a gate conductive material as illustrated in FIG. 11. In FIG. 16, local interconnect isolation openings 29 are formed via lithography by using an etch-process, e.g., RIE. Also, another shallow trench isolation 30 that belongs to peripheral transistors different from the storage transistors is illustrated.

Figure 17:
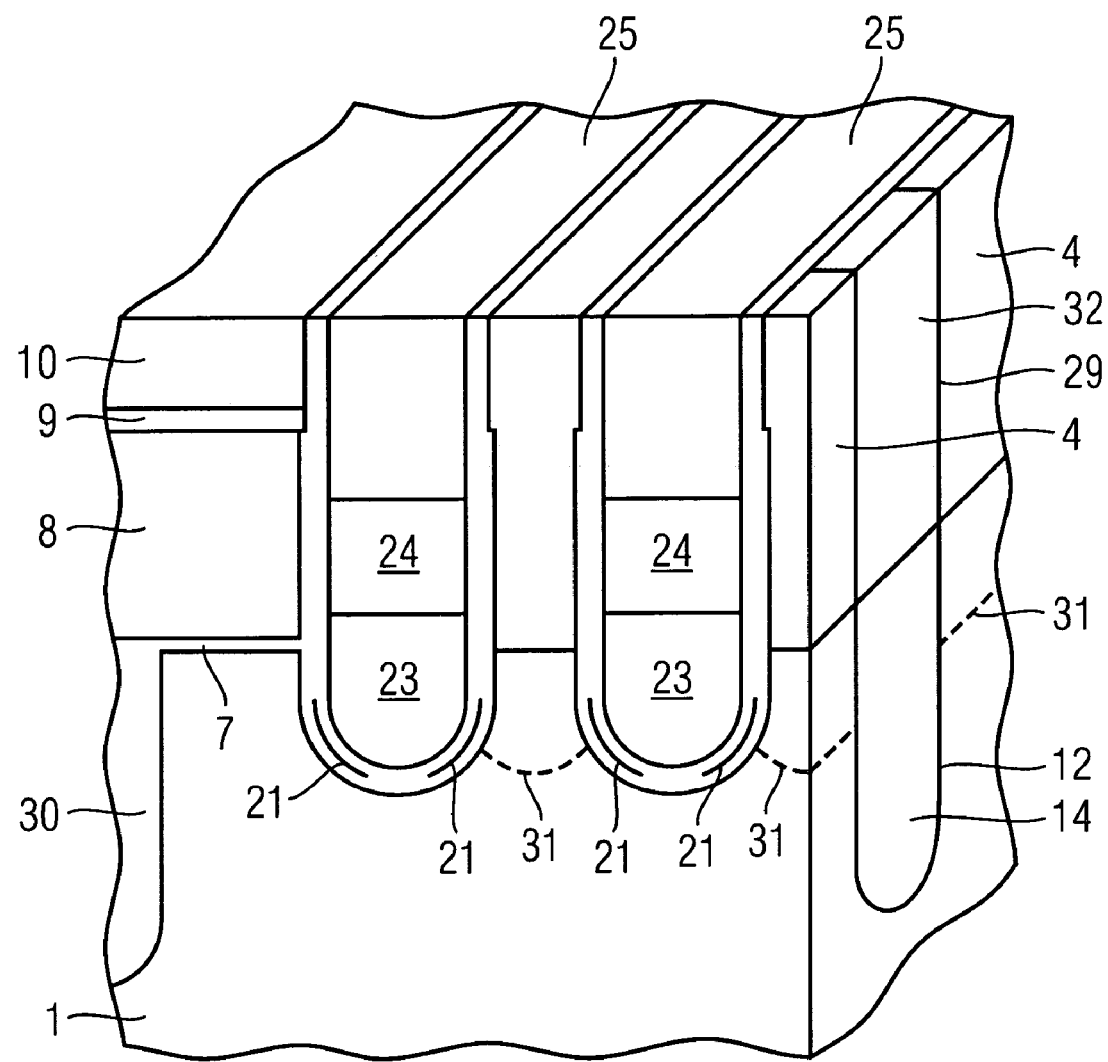
FIG. 17 illustrates one embodiment of a perspective view of a detail from another intermediate product following FIG. 16.

FIG. 17 illustrates a perspective view of a detail from another intermediate product following the intermediate product of FIG. 16. Accordingly, local interconnect isolation openings 29 have been filled with an electrically insulating material 32, e.g., an oxide, followed by a planarization of the insulating material 32. Then, local interconnect openings are obtained by selectively removing the sacrificial layer 8 between the insulating structures. Conventional lithography may be used to restrict the etching process to the local interconnect structures. An implantation of dopant(s) may follow to form source/drain regions 31 of a second polarity. Next, local interconnect openings are filled with an electrically conductive material to form local interconnects 4. Implantation of source/drain regions 31 is effected such that source/drain regions are arranged in alternating odd and even numbered columns along a first direction (y) and in alternating odd and even numbered rows along a second direction (x). And, conductive local interconnects 4 are formed such that they are respectively connecting pairs of the source/drain regions 31, where each pair of source/drain regions 31 in an even-numbered row connecting a source/drain region in an even-numbered column and an adjacent source/drain region in a subsequent odd-numbered column, and each pair of source/drain regions 31 in an odd-numbered row connecting a source/drain region 31 in an odd-numbered column and an adjacent source/drain region in a subsequent even-numbered column. Thus, local interconnects are formed in a self-aligned manner to isolations 32 and the wordline stacks 25, 24, 23.

After depositing another hard mask, gate patterning of periphery structures that is to say all CMOS devices outside the memory cell arrays and local interconnects may be performed. Then standard procedures of a high-performance CMOS process follow in order to fabricate the transistors, being well-known to those skilled in the art and need not be further detailed here. Particularly, salicided gate and source/drain regions may be fabricated. After dielectric deposition and planarization steps bit line structures may be formed to address local interconnects, where each of the bit lines connects a plurality of local interconnects 4 in either even-numbered or odd-numbered of the rows to fabricate a virtual ground array, as is known to the skilled persons (for instance disclosed in document DE 10258194 A1).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory having charge trapping memory cells comprising:
    a substrate;
    a plurality of conductive word lines;
    a plurality of memory cells including a plurality of shallow trench isolations, a plurality of source/drain regions bounded by the shallow trench isolations, a plurality of gate electrodes formed by respective parts of the word lines opposing the substrate between adjacent source/drain regions to form a plurality of channel regions, the gate electrodes being isolated from the source/drain regions by a trapping dielectric, wherein
    the gate electrodes are arranged in trenches at least partly formed in the substrate;
    the trapping dielectric comprises a storage layer sandwiched in between two boundary layers, and
    the storage layer being part of the trapping dielectric isolating one of the gate electrodes in a trench comprises at least two parts including a first part isolating the gate electrode from the source region and a second part isolating the gate electrode from the drain region, the first and second parts being formed by removing a bottom part of the storage layer located at the bottom of the trench.

2. A memory having charge trapping memory cells comprising:
    a substrate;
    a plurality of conductive word lines;
    a plurality of memory cells including a plurality of shallow trench isolations, a plurality of source/drain regions bounded by the shallow trench isolations, a plurality of gate electrodes formed by respective parts of the word lines opposing the substrate between adjacent source/drain regions to form a plurality of channel regions, the gate electrodes being isolated from the source/drain regions by a trapping dielectric, wherein:
    the gate electrodes are arranged in trenches at least partly formed in the substrate;
    the trapping dielectric comprises a storage layer sandwiched in between tow boundary layers; and
    the storage layer being part of the trapping dielectric isolating one of the gate electrodes in a trench comprises at least two parts including a first part isolating the gate electrode from the source region and a second part isolating the gate electrode from the drain region, wherein the first and second parts are arranged such that at least 30% of a length of each one of the channel regions is not opposed by the storage layer.

3. A memory having charge trapping memory cells comprising:
    a substrate;
    a plurality of conductive word lines;
    a plurality of memory cells including a plurality of shallow trench isolations, a plurality of source/drain regions bounded by the shallow trench isolations, a plurality of source/drain regions bounded by the shallow trench isolations, a plurality of gate electrodes formed by respective parts of the word lines opposing the substrate between adjacent source/drain regions to form a plurality of channel regions, the gate electrodes being isolated from the source/drain regions by a trapping dielectric, wherein;
    the gate electrodes are arranged in trenches at least partly formed in the substrate;
    the trapping dielectric comprises a storage layer sandwiched in between two boundary layers; and
    the storage layer being part of the trapping dielectric isolating one of the gate electrodes in a trench comprises at least two parts including a first part isolating the gate electrode from the source region and a second part isolating the gate electrode from the drain regions, wherein the first and second parts of the storage layer are arranged such that at least 20% of a length of each one of the channel regions is not opposed by the storage layer.

4. A semiconductor memory comprising:
    a substrate having a first polarity in a memory cell array region including a plurality of shallow trench isolations arranged substantially continuously along a first direction (y), a plurality of conductive word lines arranged along a second direction (x) transverse to the first direction and being isolated from the substrate, wherein regions of the substrate between adjacent word lines are implanted with an impurity having a second polarity, thereby producing a plurality of source/drain regions bounded by the shallow trench isolations in the second direction (x), wherein a plurality of gate electrodes being formed by respective parts of the word lines opposing the substrate between adjacent source/drain regions to form a plurality of channel regions, the gate electrodes being isolated from at least the source/drain regions by a trapping dielectric the source/drain regions being arranged in alternating odd and even numbered columns along the first direction (x) and in alternating odd and even numbered rows along the second direction (x);

a plurality of conductive local interconnects substantially above the trench isolations electrically connecting pairs of the source/drain regions, each pair of source/drain regions in an even-numbered row connecting a source/drain region in an even-numbered column and an adjacent source/drain region in a subsequent odd-numbered column, and each pair of source/drain regions in an odd-numbered row connecting a source/drain region in an odd-numbered column and an adjacent source/drain region in a subsequent even-numbered column; and a plurality of conductive bit lines arranged along the first direction (y) above the local interconnects, each of the bit lines connecting a plurality of local interconnects in either even-numbered or odd-numbered of the rows, wherein the gate electrodes are arranged in trenches at least partly formed in the substrate.

5. The semiconductor memory of claim 4, wherein the trapping dielectric consists of a storage layer sandwiched in between two boundary layers.

6. The semiconductor memory of claim 5, wherein the storage layer being part of the trapping dielectric isolating one of the gate electrodes in a trench comprises at least two parts including a first part isolating the gate electrode from the source region and a second part isolating the gate electrode from the drain region.

7. The semiconductor memory of claim 6, wherein the first and second parts of the storage layer being formed by removing a bottom part of the storage layer located at the bottom of the trench.

8. The semiconductor memory of claim 7, wherein the first and second parts of the storage layer are arranged such that at least 30% of a length of each one of the channel regions is not opposed by the storage layer.

9. The semiconductor memory of claim 7, wherein the first and second parts of the storage layer are arranged such that at least 20% of a length of each one of the channel regions is not opposed by the storage layer.

10. The semiconductor memory of claim 4, wherein each one of the channel regions facing the gate electrode comprises at least one curved region, such that a width of the channel region in a direction perpendicular to a line connecting the source/drain regions adjacent the channel region is enlarged.

11. The semiconductor memory of claim 4, wherein the trenches are formed to be essentially U-shaped.

12. The semiconductor memory of claim 4, wherein the source/drain regions are arranged laterally adjacent the word lines.

13. The semiconductor memory of claim 4, wherein the gate electrodes are substantially completely isolated from the substrate by the trapping dielectric layer.

14. The semiconductor memory of claim 4, which is adapted to be operated as a virtual ground NOR memory cell array.

15. The semiconductor memory of claim 4, which is adapted to be operated as a multi-bit memory cell memory.

16. The semiconductor memory of claim 4, wherein the storage layer is a nitride layer and wherein the boundary layers are oxide layers.

17. The semiconductor memory of claim 4, wherein the local interconnects are formed of an electrically conductive material other than polysilicon.

18. The semiconductor memory of claim 4, which is adapted to be operated as a symmetrical charge trapping memory.

* * * * *